(12) United States Patent
Limotyrakis

(10) Patent No.: US 7,768,324 B1
(45) Date of Patent: Aug. 3, 2010

(54) DUAL VOLTAGE BUFFER WITH CURRENT REUSE

(75) Inventor: Sotirios Limotyrakis, Mountain View, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 0 days.

(21) Appl. No.: 12/062,479

(22) Filed: Apr. 3, 2008

(51) Int. Cl.
*H03B 1/00* (2006.01)
(52) U.S. Cl. .................... 327/108; 327/112; 326/81; 326/83
(58) Field of Classification Search ............ 326/82, 326/83, 32; 327/108, 112
See application file for complete search history.

(56) References Cited

U.S. PATENT DOCUMENTS

| | | | | |
|---|---|---|---|---|
| 5,914,633 A * | 6/1999 | Comino et al. | ............ | 327/553 |
| 6,188,212 B1 * | 2/2001 | Larson et al. | ............ | 323/281 |
| 6,335,633 B1 * | 1/2002 | Kirsch | ............ | 326/34 |
| 6,628,149 B2 * | 9/2003 | Ajit | ............ | 327/108 |
| 6,794,929 B2 * | 9/2004 | Pelly | ............ | 327/552 |
| 6,859,074 B2 * | 2/2005 | Ajit | ............ | 327/108 |
| 6,876,248 B2 * | 4/2005 | Nguyen et al. | ............ | 327/538 |

* cited by examiner

*Primary Examiner*—Vibol Tan
(74) *Attorney, Agent, or Firm*—Bever, Hoffman & Harms, LLP; Jeanette S. Harms

(57) ABSTRACT

A voltage buffer with current reuse is described. This voltage buffer can advantageously provide a relatively wide voltage differential using a relatively low current. In one embodiment, a slave branch can be used to minimize potential spikes/glitches in the voltage buffer.

24 Claims, 4 Drawing Sheets

DUAL VOLTAGE BUFFER WITH CURRENT REUSE

BACKGROUND OF THE INVENTION

1. Field of the Invention

The invention generally relates to a buffer and more particularly to a dual voltage buffer with current reuse.

2. Related Art

Analog-to-digital converters (ADCs) may be utilized in a variety of integrated circuit (IC) implementations. One such use is to digitize received signals in wireless communication. For example, an ADC may be utilized to convert radio frequency (RF) signals received by an antenna into digital signals. ADCs generally include voltage buffers to provide reference voltages to other circuitry in the ADC. In modern circuit design, especially for portable applications or applications with otherwise set maximum power dissipation limits, limiting the current used in analog parts of the circuit can be very important to reduce power consumption and heat generation. However, a voltage buffer usually requires a high current to provide low output impedance.

Furthermore, to reduce power consumption, reduce heat generation, and comply with physical limits of technology, power supply voltages are constantly being lowered in advanced modern CMOS technologies. To be able to maintain the operation of bias sections of voltage buffers in a lowered power supply environment, the driven voltages may have to be very close to each other and near the middle of the available voltage range. However, many applications of such driven voltages (including in an ADC) require a relatively wide voltage differential.

Therefore, a need arises for a voltage buffer that can provide a relatively wide voltage differential using a relatively low current.

SUMMARY OF THE INVENTION

A voltage buffer that can provide a relatively wide voltage differential using a relatively low current is provided. This voltage buffer can include a current source, three transistors, and three amplifiers. The current source can be coupled between a first voltage source and a first output node. The first, second, and third transistors can be coupled in series between the first output node and a second voltage source. A second output node can be located between the second and third transistors, and a mid-range node can be located between the first and second transistors. The first, second, and third amplifiers can drive gates of the first, second, and third transistors, respectively. The first amplifier has an input terminal coupled to the first output node, the second amplifier has an input terminal coupled to the second output node, and the third amplifier has an input terminal coupled to the mid-range node.

In one embodiment, the first voltage source is VDD, the second voltage source is ground, the first transistor is a PMOS transistor, the second and third transistors are NMOS transistors, the input terminals for the first and second amplifiers are inverting terminals, the input terminal for the third amplifier is a non-inverting terminal, and the first, second, and third amplifiers include input terminals for receiving an initial high voltage, an initial low voltage, and an initial mid-range voltage, respectively.

In another embodiment, the first voltage source is ground, the second voltage source is VDD, the first transistor is an NMOS transistor, the second and third transistors are PMOS transistors, the input terminals for the first and second amplifiers are inverting terminals, the input terminal for the third amplifier is a non-inverting terminal, and the first, second, and third amplifiers include input terminals for receiving an initial low voltage, an initial high voltage, and an initial mid-range voltage, respectively.

A voltage buffer that minimizes spikes and glitches is also provided. This voltage buffer can include a master branch and a slave branch. The master branch can include a first voltage source, three transistors, and three amplifiers. The first current source can be coupled to the first voltage source. The first, second, and third transistors can be coupled in series between the first voltage source and a second voltage source. The first, second, and third amplifiers can drive the gates of the first, second, and third transistors, respectively. The first amplifier has an input terminal coupled to a source of the first transistor, the second amplifier has an input terminal coupled to a source of the second transistor, and the third amplifier has an input terminal coupled to drains of the first and second transistors.

The slave branch can include second and third current sources as well as fourth and fifth transistors. The second and third current sources can be coupled to the first and second voltage sources, respectively. The fourth and fifth transistors can be coupled in series between the second and third current sources. The first and second amplifiers can drive gates of the fourth and fifth transistors, respectively. A first output node can be located at a source of the fourth transistor, and a second output node can be located at a source of the fifth transistor.

In one embodiment, the first voltage source is ground, the second voltage source is VDD, the first and fourth transistors are NMOS transistor, the second, third, and fifth transistors are PMOS transistors, the input terminals for the first and second amplifiers are inverting terminals, the input terminal for the third amplifier is a non-inverting terminal, and the first, second, and third amplifiers include input terminals for receiving an initial low voltage, an initial high voltage, and an initial mid-range voltage, respectively.

In another embodiment, the first voltage source is VDD, the second voltage source is ground, the first and fourth transistors are PMOS transistor, the second, third, and fifth transistors are NMOS transistors, the input terminals for the first and second amplifiers are inverting terminals, the input terminal for the third amplifier is a non-inverting terminal, and the first, second, and third amplifiers include input terminals for receiving an initial high voltage, an initial low voltage, and an initial mid-range voltage, respectively.

A method of operating a voltage buffer is also provided. This voltage buffer includes first, second, and third transistors coupled in series. In this method, a first transistor circuit can be used to adjust a voltage level at a source of the first transistor based on a first initial voltage and a current received at the source of the first transistor. A second transistor circuit can be used to adjust a voltage level at a source of the second transistor based on a second initial voltage and a current received at the source of the second transistor. A third transistor circuit can be used to adjust a voltage level at a drain of the second transistor based on a third initial voltage. Advantageously, the voltage level at the drain of the second transistor can be selected to operate the first and second transistors in saturation.

The method can further include generating a first output voltage at the source of the first transistor and generating a second output voltage at the source of the second transistor. Notably, the first and second output voltages can stay substantially constant even with transistor size variations, technology parameter variations, supply voltage variations, temperature variations, and current-source current variations.

DETAILED DESCRIPTION OF THE DRAWINGS

In accordance with one feature of the described embodiments, one current source in a voltage buffer can advantageously be used for driving two reference voltages $V_H$ and $V_L$. Because this current source can generate both reference voltages, this generation is generically referred to as "current reuse". Current reuse can provide significant power savings and heat generation reduction compared to conventional driver circuits that require separate current sources for each driven voltage.

Figure 1:
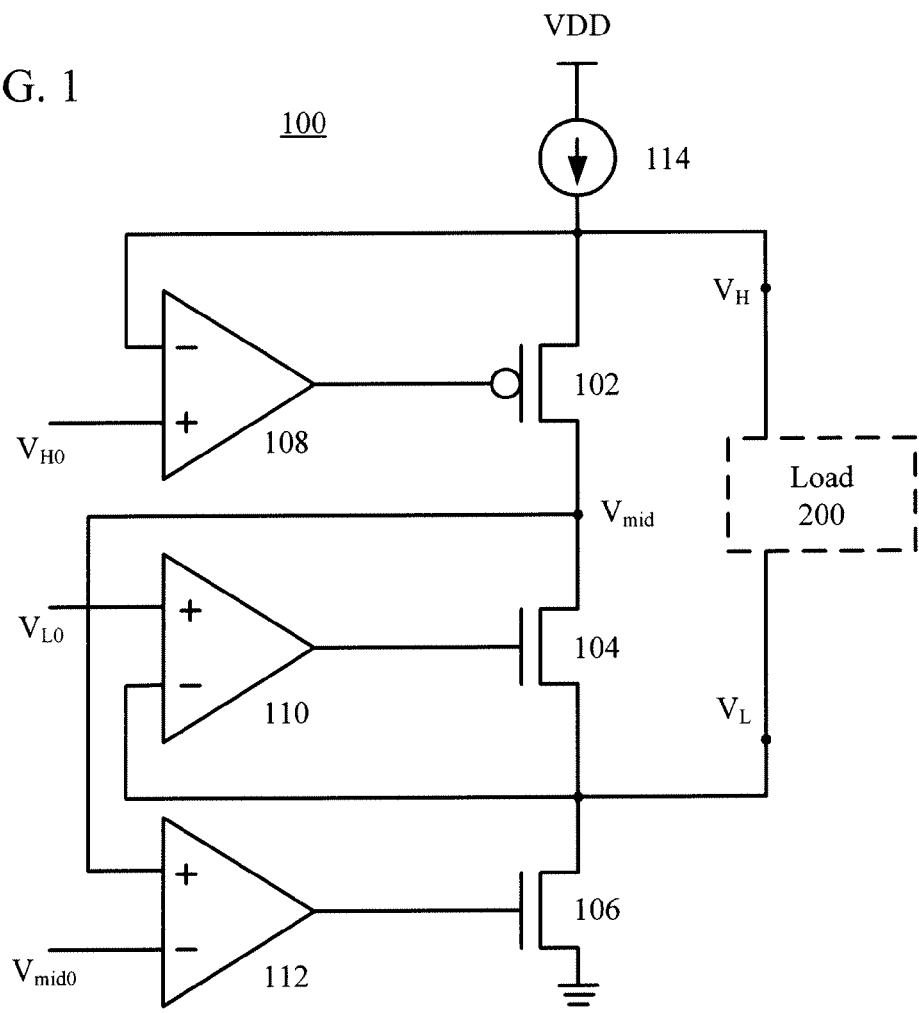
FIGS. 1 and 3-5 illustrate circuit diagrams of various voltage buffers with current reuse.

FIG. 1 illustrates an exemplary dual voltage buffer 100 providing current reuse. In this embodiment, buffer 100 includes a PMOS transistor 102, NMOS transistors 104 and 106, three amplifiers 108, 110, and 112, and a single current source 114. Current source 114, PMOS transistor 102, and NMOS transistors 104 and 106 are coupled in series between voltage source VDD and ground. Current source 114 can generate a current based on voltage source $V_{dd}$, wherein part of that current can flow through conducting transistors 102, 104, and 106 to ground. In one embodiment, current source 114 may be a PMOS-based current source.

In this embodiment, amplifier 108 controls the gate of PMOS transistor 102; amplifier 110 controls the gate of NMOS transistor 104; and amplifier 112 controls the gate of NMOS transistor 106. Amplifiers 108, 110, 112 can be any type of amplifier (e.g. an operational amplifier), possess any amount of gain, and be built using any amplifier circuit technique. Amplifiers 108, 110, and 112 may have a limited bandwidth, wherein such a design choice leads to a low-power implementation for these amplifiers.

In this configuration of voltage buffer 100, the inverting input terminal of amplifier 108 is coupled to the source of transistor 102, whereas the non-inverting input terminal of amplifier 108 receives a high input voltage $V_{R0}$. The inverting input terminal of amplifier 110 is coupled to the source of transistor 104, whereas the non-inverting input terminal of amplifier 110 receives a low input voltage $V_{L0}$. The non-inverting input terminal of amplifier 112 is coupled to the drain of transistor 102, whereas the inverting input terminal of amplifier 112 receives a mid-range input voltage $V_{mid0}$.

Figure 2:
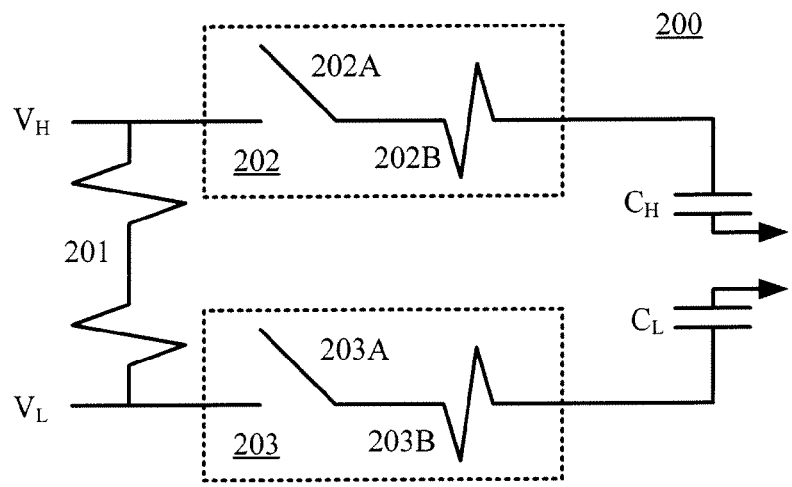
FIG. 2 illustrates an exemplary load.

As discussed above, voltage buffer 100 can provide two reference voltages (marked as output nodes) $V_H$ and $V_L$. These two reference voltages can be used to drive a load 200 (shown for convenience in FIG. 1). FIG. 2 illustrates an exemplary load 200, which can include a resistor 201, switches 202 and 203, and capacitors $C_H$ and $C_L$. In this embodiment of load 200, resistor 201 is coupled between nodes $V_L$ and $V_H$. Switch 202 can include an ideal switch 202A and a resistor 202B, which models the resistance of an actual switch. Switch 202 is coupled between node $V_H$ and a first terminal of capacitor $C_H$. In a similar configuration, switch 203 can include an ideal switch 203A and a resistor 203B, which models the resistance of an actual switch. Switch 203 is coupled between node $V_L$ and a first terminal of capacitor $C_L$. Switches 202 and 203 can be implemented using NMOS transistors, PMOS transistors, or any combination of NMOS and PMOS transistors.

In their off (i.e. non-conducting) state, switches 202 and 203 provide a high resistance, thereby effectively decoupling capacitor $C_H$ from node $V_H$, and capacitor $C_L$ from node $V_L$. The second terminals of capacitors 204 and 205 can be coupled to electrical networks (not shown for convenience). Such electrical networks typically provide a suitably low impedance so as not to substantially inhibit current flow through capacitors $C_H$ and $C_L$ when switches 202 and 203 are conducting.

Note that part of the current generated by current source 114 flows through load 200, e.g. through resistor 201 and also through the branch comprising switch 202 and capacitor $C_H$. The current that flows through resistor 201 may flow into node $V_L$ and through transistor 106 into ground. Similarly, any current through the branch comprising switch 203 and capacitor $C_L$ (i.e. from the electrical networks coupled to capacitor $C_L$) may flow through transistor 106 into ground. In one embodiment, the currents flowing through $C_H$ and $C_L$ may be substantially similar.

In the configuration shown in FIG. 1, transistors 102 and 104 function as source followers, wherein the voltages at their respective source terminals follow the variations of their gate voltages. In contrast, transistor 106 functions as a common-source coupled transistor, wherein gate voltage variations translate into amplified current variations at its drain. In one embodiment, transistors 102, 104, and 106 may operate in their saturation regions.

In the embodiment of FIG. 1, amplifier 110 and transistor 104 are coupled in a negative feedback configuration, wherein amplifier 110 forces the gate of transistor 104 to a suitable voltage level such that the source of transistor 104 is set to a voltage almost identical to voltage $V_{L0}$. That is, amplifier 110 attempts to establish a near "virtual short" condition at its input by forcing voltages $V_{L0}$ and $V_L$ to be almost equal. The higher the gain of amplifier 110, the closer $V_L$ may be to $V_{L0}$. The voltage $V_{L0}$ is the archetype voltage used to generate $V_L$.

Similarly, amplifier 108 and transistor 102 are coupled in a negative feedback configuration wherein amplifier 108 forces the gate of transistor 102 to a suitable voltage level such that the source of transistor 102 is set to a voltage almost identical to voltage $V_{H0}$. Again, the higher the gain of amplifier 108, the closer $V_H$ may be to $V_{H0}$.

The voltages $V_{L0}$ and $V_{H0}$ need not be provided at a low impedance level. Their generation may be done using any low current and/or low power circuit. As an example, a simple high impedance resistor divider may be used to provide $V_{L0}$ and $V_{H0}$.

The load 200 may model an electronic device, such as an ADC. In an embodiment driving reference voltages into a successive-approximation-register (SAR) ADC, switches 202 and 203 along with capacitors 204 and 205 represent the equivalent load the ADC presents to a dual voltage buffer. Upon closing of switches 202 and 203, the initial voltage across capacitors $C_H$ and $C_L$ may be different from the so-called "steady-state" voltage that would be present across said capacitors if switches 202 and 203 were to remain closed for an indefinite period of time. These voltage discrepancies may cause transient voltage phenomena to take place across capacitors $C_H$ and $C_L$. The recovery from such transients may be governed, to first order, by the time constant $RC_H$ for capacitor $C_H$ and the time constant $RC_L$ for capacitor $C_L$.

Time constant $RC_H$ may be computed by multiplying the equivalent capacitance of capacitor $C_H$ with a resistance $R_H$, which may be equal to the sum of the resistance of switch 202B, plus the equivalent resistance as seen from the switch 202B looking away from the load. For example, the equivalent resistance seen by switch 202B may be a portion of resistor 201 in parallel with the output impedance of voltage buffer 100 at the $V_H$ node (e.g. approximately equal to the inverse of the transconductance (gm) of transistor 102). Similarly, time constant $RC_L$ may be computed by multiplying the equivalent capacitance of capacitor $C_L$ with a resistance $R_L$, which may be equal to the sum of the resistance of switch 203B, part of the resistance of resistor 201, and the output impedance of voltage buffer 100 at the $V_L$ node (e.g. approximately equal to the inverse of the transconductance (gm) of transistor 104). In one embodiment, $RC_H$ may be similar to $RC_L$, capacitors 204 and 205 may have similar capacitance, and the transconductances of transistors 102 and 104 may also be similar.

The voltage transient recovery on capacitors $C_H$ and $C_L$, after closing switches 202 and 203, may be faster for smaller values of time constants $RC_H$ and $RC_L$ respectively. Smaller values for $RC_H$ and $RC_L$, and hence faster recovery, may be achieved with larger gm for transistors 102 and 104, respectively. Alternatively, smaller values for $RC_H$ and $RC_L$, and hence faster recovery, may be achieved with smaller resistances for switches 202B and 203B, as well as resistance 201. If switches 202 and 203 remain closed for a period of time larger than the equivalent time of multiple time constants $RC_H$ and $RC_L$, the voltages across capacitors $C_H$ and $C_L$ may reach values very close to their steady-state values prior to the subsequent opening of switches 202 and 203. Hence, almost full charging of capacitors $C_H$ and $C_L$ may occur. Note that almost full charging of capacitors $C_H$ and $C_L$ may be achieved even when the bandwidths of amplifiers 108 and 110 are much smaller than the inverse of time constants $RC_H$ and $RC_L$, respectively.

To achieve almost complete settling for the voltages across capacitors $C_H$ and $C_L$ during the allocated time of conduction of switches 202 and 203, the transconductances of transistors 102 and 104 may need to be large. In turn, these large transconductances may require a relatively large amount of current to be generated by current source 114 (notably the only current source needed by voltage buffer 100) and a relatively large amount of current through transistors 102 and 104. To support this current, transistors 102 and 104 can be constructed with a relatively large channel width. For example, a transistor may need a channel width of about 1.6 mm to support 2.5 mA of current.

In the configuration shown in FIG. 1, transistor 106 can sink the current that passes through transistor 104 and node $V_L$. However, the voltage level needed at the gate of transistor 106 to sink this current may not be known accurately at all times. Furthermore, the required voltage at the gate of 106 may vary according to size variation for transistors 102, 104, and 106 (e.g. caused by process technology imperfections), variability of transistor electrical characteristics among nominally identical implementations of the invention, temperature variations, power supply voltage variations and/or variations of the current provided by current source 114. However, notably, the required voltage at the gate of transistor 106 can be advantageously set automatically, with the use of negative feedback.

Amplifier 112 and transistor 106 are also configured in a negative feedback loop, wherein amplifier 112 forces the gate of transistor 106 to a suitable voltage level such that the drain of transistor 104 is set to a voltage almost identical to voltage $V_{mid}$. That is, amplifier 112 attempts to establish a near "virtual short" condition at its input by forcing voltages $V_{mid0}$ and $V_{mid}$ to be almost equal. The voltage $V_{mid0}$ is the archetype voltage used to generate $V_{mid}$. Note that voltage $V_{mid0}$ generally need not be provided at a low impedance level. Thus, its generation may therefore be done using any low current and/or low power circuit. For example, a simple high impedance resistor divider may be used to provide $V_{mid0}$.

In some embodiments, the voltage $V_{mid}$ may not need to be set extremely accurately. Furthermore, the bandwidth of the negative feedback loop comprising amplifier 112 and transistor 106 may be small. Fortunately, inaccurate setting and/or voltage variations of $V_{mid}$ (e.g. due to transients in other parts of voltage buffer 100) may not, for the most part, affect the operation of voltage buffer 100 adversely, provided that said inaccuracy and variations do not cause transistors 102 and 104 to leave the saturation region of operation. Notably, the negative feedback loop comprising amplifier 112 and transistor 106 may be sufficient to set the necessary voltage at the gate of transistor 106 even in the presence of variations in size, electrical parameter, and/or temperature of transistors 102, 104, and 106, as well as power supply voltage variations or variations of the current provided by current source 114.

In one embodiment, the supply voltage VDD may be approximately 1200 mV and the current supplied by current source 114 may be approximately 3 mA. In this case, voltages $V_H$, $V_{mid}$, $V_L$ may be established at approximately 850 mV, 600 mV, and 350 mV, respectively. Thus, the voltage difference between $V_H$ and $V_L$ is approximately 500 mV. For transistors 102, 104, and 106, the absolute value of the saturation drain-to-source voltage (|Vdsat|) may be at approximately 100 mV or less. In order for transistors 102, 104, and 106 to be in saturation, their respective absolute drain-to-source voltages (|Vds|) should be higher than their respective |Vdsat| (e.g. by approximately 100 mV). In one embodiment, the |Vds| for transistors 102, 104, and 106 can be 250 mV, 250 mV, and 350 mV, respectively. Where current source 114 is realized with a PMOS transistor with its source coupled to VDD and its drain coupled to the source of transistor 102, there may be 350 mV available for the |Vds| of transistor 102. Note that this voltage may allow transistors 102, 104, and 106 to operate in saturation, provided also that the |Vdsat| of any PMOS-realized current source 114 is also approx. 100 mV or less.

In one embodiment of voltage buffer 100 exhibiting the aforementioned voltages, the voltages at the gates of transistors 102, 104, and 106 may be respectively at approximately 445 mV, 725 mV, and 375 mV, respectively. Such gate voltages are well within the range defined by VDD and ground and may enable a compact and low-power implementation for amplifiers 108, 110, and 112.

The voltage arrangement presented above may therefore be robust and sustain voltage variations due to transistor size, electrical characteristics, temperature, as well as circuit supply variations or current source 114 current variations. Variations as much as 150 mV above or below a $V_{mid}$ of 600 mV may also be sustained by voltage buffer 100 with all transistors remaining in saturation. Such variations in $V_{mid}$ may be partially due to voltage transients in other parts of voltage buffer 100.

While satisfying the condition of any transistor |Vds| being greater than |Vdsat| by approximately 100 mV, the voltage arrangement in some embodiments may be modified in any number of ways, given the voltage headroom available for the |Vds| of the transistors. For example, in one embodiment, VDD may be as low as 900 mV, whereas $V_H$, $V_{mid}$, and $V_L$ may be approximately 700 mV, 450 mV, and 200 mV, respectively. In this case, the voltage difference between $V_H$ and $V_L$ is still approximately 500 mV, wherein each transistor can still have a |Vds| higher than its |Vdsat| by approximately 100 mV. In another embodiment, VDD may be 1200 mV, whereas $V_H$, $V_{mid}$, and $V_L$ may be approximately 1000 mV, 600 mV, and 200 mV, respectively. Thus, in this case, the voltage difference between $V_H$ and $V_L$ may be as high as 800 mV.

Figure 3:
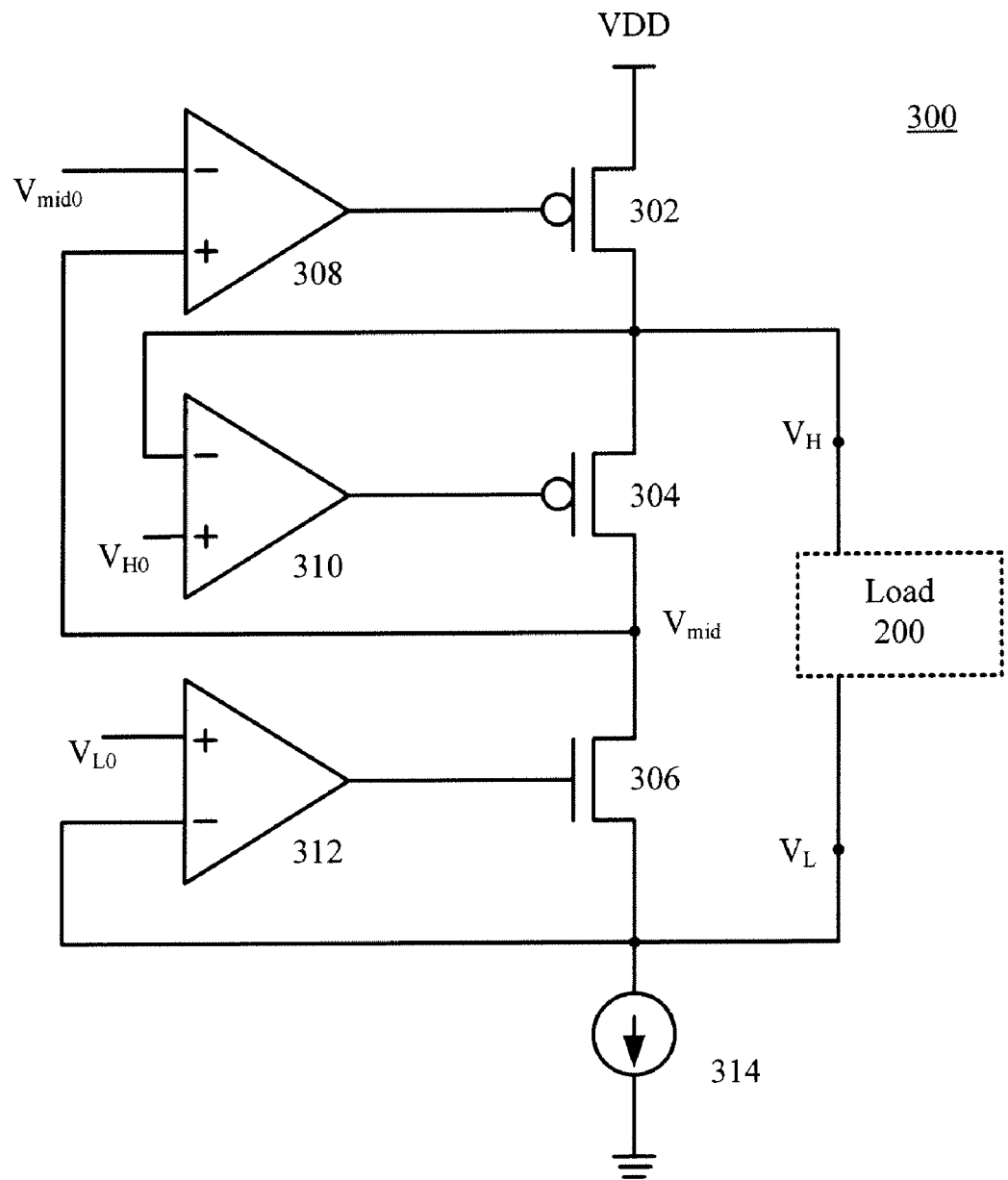

FIG. 3 illustrates another exemplary voltage buffer 300 with current reuse. In this embodiment, PMOS transistor 302, PMOS transistor 304, NMOS transistor 306, and a current source 314 can be coupled in series between voltage source VDD and ground. In this configuration, current source 314 can act as a current sink. In one embodiment, the current source 314 may be an NMOS-based current source.

In this embodiment, an amplifier 308 controls the gate of PMOS transistor 302; an amplifier 310 controls the gate of PMOS transistor 304; and an amplifier 312 controls the gate of NMOS transistor 306. Amplifiers 308, 310, and 312 can be any type of amplifier (e.g. an operational amplifier), possess any amount of gain, and be built using any amplifier circuit technique. In the embodiment, the non-inverting input terminal of amplifier 308 is coupled to the drains of transistors 304/306, whereas the inverting input terminal of amplifier 308 receives the mid-range input voltage $V_{mid0}$. The inverting input terminal of amplifier 310 is coupled to the source of transistor 304, whereas the non-inverting input terminal of amplifier 310 receives the high input voltage $V_{H0}$. The inverting input terminal of amplifier 312 is coupled to the source of transistor 306, whereas the non-inverting input terminal of amplifier 312 receives the low input voltage $V_{L0}$. In the above-described configuration, voltage buffer 300 may function similarly as voltage buffer 100 (FIG. 1). For example, amplifier 308 and transistor 302 can set a midpoint voltage $V_{mid}$ between transistors 304 and 306 such that transistors 304 and 306 operate in saturation.

Figure 4:
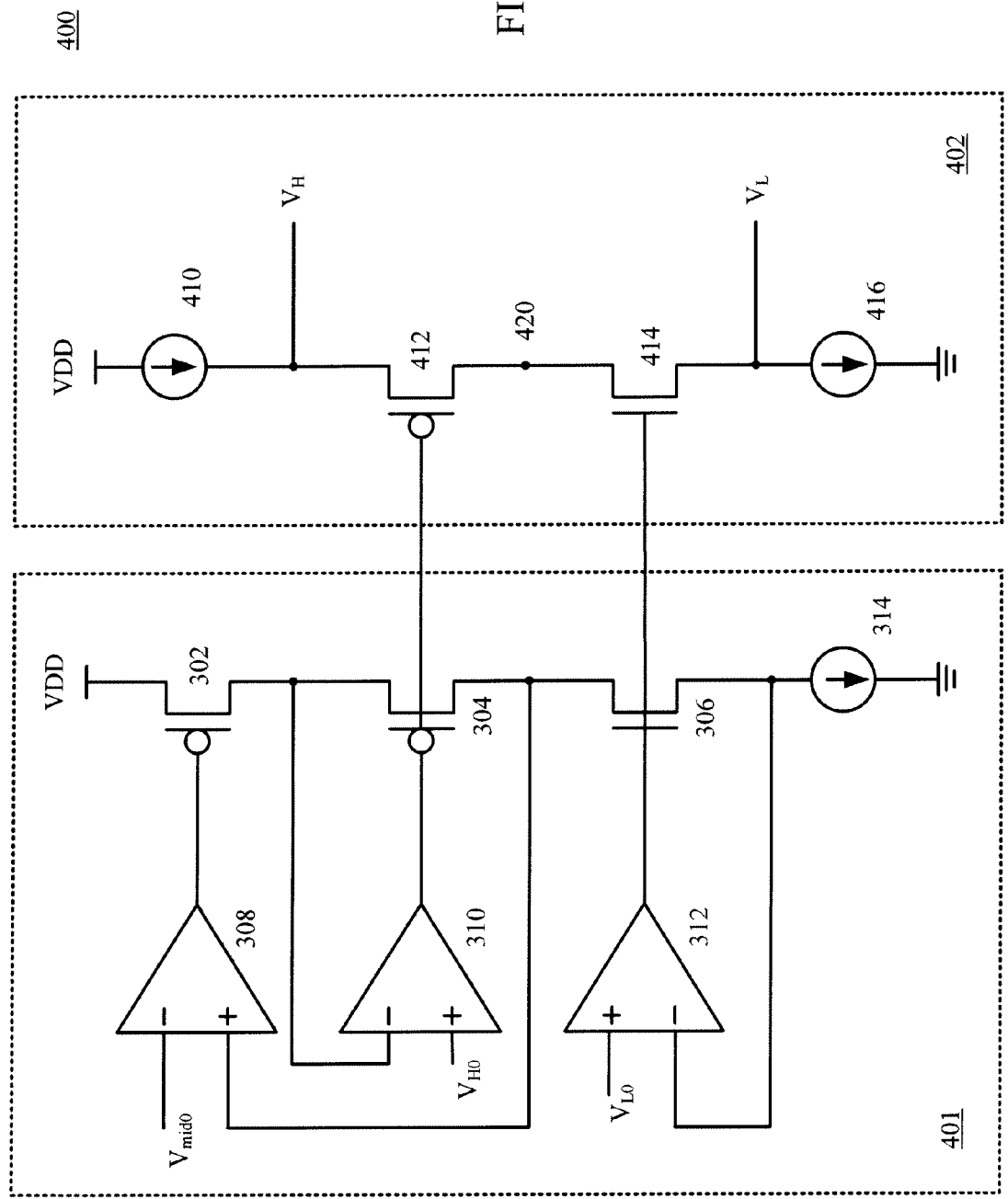

FIG. 4 illustrates yet another exemplary voltage buffer 400 with current reuse. In this embodiment, voltage buffer 400 includes a master branch 401 (which in one embodiment may include the same or similar components as voltage buffer 300 of FIG. 3) and a slave branch 402. Slave branch 402 includes a first current source 410, a PMOS transistor 412, an NMOS transistor 414, and a second current source 416 coupled in series between voltage source VDD and ground.

As shown in FIG. 4, the outputs of master branch 401 (i.e. the control signals of transistors 304 and 306) may be provided to the gates of transistors 412 and 414. In some embodiments, current sources 410 and/or 416 may be independent or dependent current sources. If a dependent current source is used, the current may be determined by other circuit characteristics. For example, a dependent current source may source or sink an amount of current in proportion to an amount of current flowing in the slave branch 402.

Advantageously, slave branch 402 may offer some isolation from voltage regulation disturbances that may come from transients in the load (not shown, but coupled to nodes $V_H$ and $V_L$). For example, referring back to load 200 of FIG. 2, the closing of switch 202 may require a relatively substantial amount of current to charge capacitor $C_H$. This current may cause $V_H$ in voltage buffer 100 to temporarily spike or glitch. In contrast, a spike or glitch in $V_H$ in voltage buffer 400 can be substantially limited to transistor 412, thereby advantageously minimizing potential spikes/glitches in master branch 401 (e.g. in amplifiers 308, 310, and 312).

In one embodiment, transistors 412 and 414 can have different physical geometry than transistors 302, 304, and 306. For example, transistors 412 and 414 can be formed to supply more current than transistors 302, 304, and 306. Thus, master branch 401 may be relatively small because only relatively small amounts of current may be required to drive components in slave branch 402.

In one embodiment, a feedback signal provided at node 420 can be used to regulate the current in slave branch 402 and ensure that transistors 412 and 414 operate in saturation. Note that any number of slave branches can be used to distribute reference voltages $V_H$ and $V_L$. For example, first and second slave branches can be instantiated in separate locations in a chip design, wherein each slave branch can provide $V_H$ and $V_L$ to its nearby circuits. In an alternative embodiment, two or more slave branches may be used in parallel to provide increased current source/sink ability at the $V_H$ and $V_L$ voltages. In yet another embodiment, a plurality of slave branches may be selectively coupled in parallel to provide more or less current.

Figure 5:
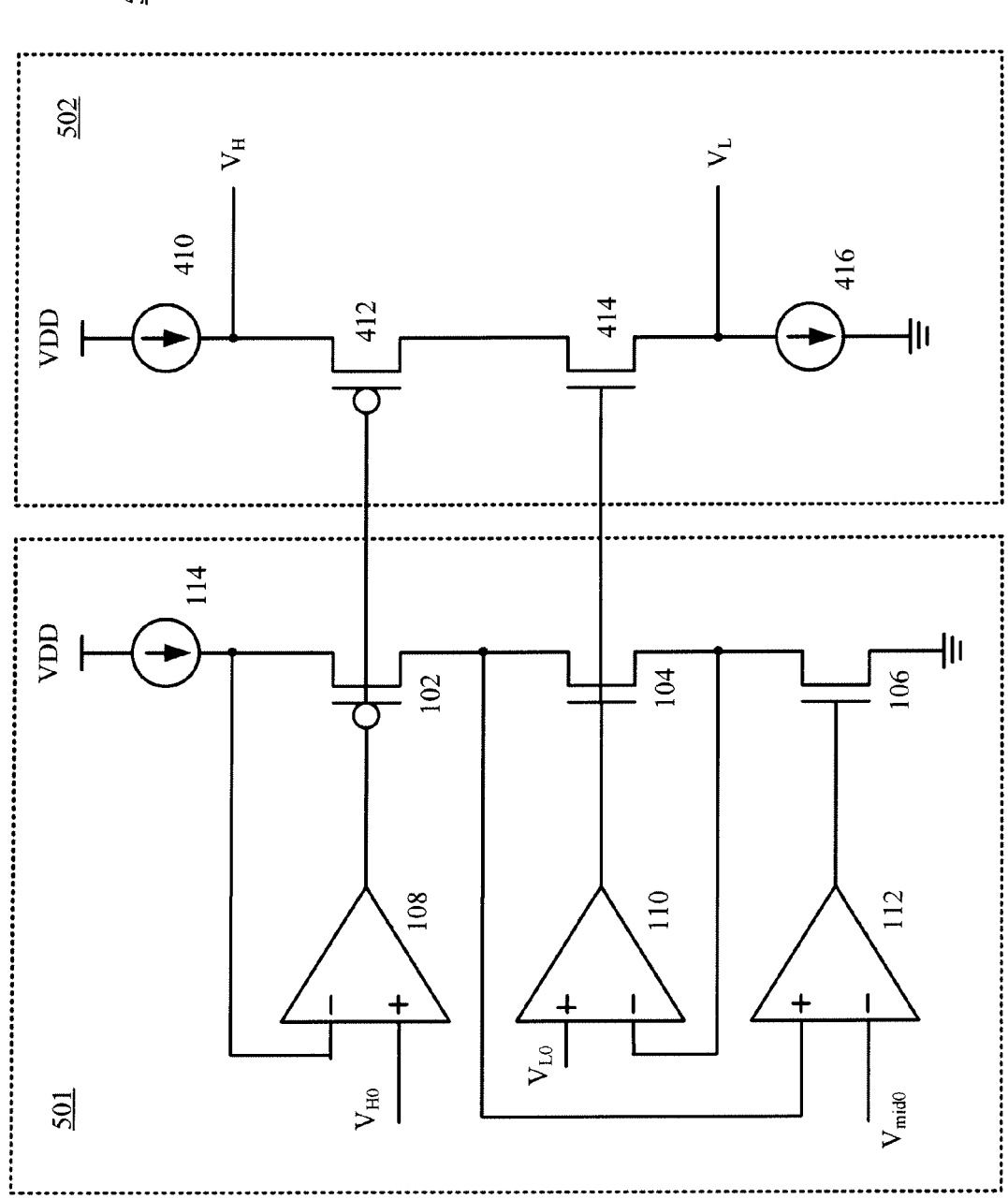

FIG. 5 illustrates yet another exemplary voltage buffer 500 with current reuse. In this embodiment, voltage buffer 500 includes a master branch 501 (which in one embodiment may include the same or similar components as voltage buffer 100 of FIG. 1) and a slave branch 502 (which in one embodiment may include the same or similar components as slave branch 402 of FIG. 4). As shown in FIG. 5, the outputs of master branch 501 (i.e. the control signals of transistors 102 and 104) may be provided to the gates of transistors 412 and 414.

The above-described configurations may be extremely useful in applications that require buffering of two voltages. For example, a fully differential analog-to-digital converter (ADC) may require two voltages as analog references. The above-described voltage buffers may be used to drive both of these voltages into the core or other components of the ADC.

In one embodiment, one of the above-described voltage buffers can be used in a successive-approximation-register (SAR) ADC, which converts a continuous analog waveform into a discrete digital representation via a binary search through possible quantization levels before finally converging upon a digital output for each conversion. Implementations of fast SAR ADC architectures typically employ switched-capacitor networks to process the input analog signal. The aforementioned binary search may be performed serially in time, thereby leading to greatly reduced time intervals available for each step of the search. Reference voltages can be used to set the output voltage of the DAC that forms part of the SAR ADC. Because the DAC output voltage is compared to the analog input at each step of the search, the reference voltages generally need relatively fast settling times. The above-described embodiments of voltage buffers can provide these desirable fast settling times. Note that a SAR ADC architecture may be readily combined with advanced scaled CMOS technologies (e.g. 0.13 um CMOS or lower).

In another embodiment, one the above-described voltage buffers can be used in a receive baseband path of wireless (e.g. WiFi (Wireless Fidelity)) devices.

Note that the above-described embodiments of voltage buffers can provide low-voltage operation while maintaining the current reuse. Note further that the voltage and current values mentioned in association with embodiments of the invention are sample values and may change depending on implementation.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following claims and their equivalents.

The invention claimed is:

1. A voltage buffer comprising:
    a current source coupled between a first voltage source and a first output node;
    first, second, and third transistors coupled in series between the first output node and a second voltage source, wherein a second output node is located between the second and third transistors, and wherein a mid-range node is between the first and second transistors; and
    first, second, and third amplifiers driving gates of the first, second, and third transistors, respectively,
    wherein the first amplifier has an input terminal coupled to the first output node, the second amplifier has an input terminal coupled to the second output node, and the third amplifier has an input terminal coupled to the mid-range node.

2. The voltage buffer of claim 1, wherein the first voltage source is VDD and the second voltage source is ground.

3. The voltage buffer of claim 2, wherein the first transistor is a PMOS transistor, and the second and third transistors are NMOS transistors.

4. The voltage buffer of claim 3, wherein the input terminals for the first and second amplifiers are inverting terminals, and the input terminal for the third amplifier is a non-inverting terminal.

5. The voltage buffer of claim 4, wherein the first, second, and third amplifiers include input terminals for receiving an initial high voltage, an initial low voltage, and an initial mid-range voltage, respectively.

6. The voltage buffer of claim 1, wherein the first voltage source is ground and the second voltage source is VDD.

7. The voltage buffer of claim 2, wherein the first transistor is an NMOS transistor, and the second and third transistors are PMOS transistors.

8. The voltage buffer of claim 3, wherein the input terminals for the first and second amplifiers are inverting terminals, and the input terminal for the third amplifier is a non-inverting terminal.

9. The voltage buffer of claim 4, wherein the first, second, and third amplifiers include input terminals for receiving an initial low voltage, an initial high voltage, and an initial mid-range voltage, respectively.

10. A voltage buffer comprising:
    a master branch including:
        a first current source coupled to a first voltage source; first, second, and third transistors coupled in series between the first current source and a second voltage source; and
        first, second, and third amplifiers driving gates of the first, second, and third transistors, respectively,
        wherein the first amplifier has an input terminal coupled to a source of the first transistor, the second amplifier has an input terminal coupled to a source of the second transistor, and the third amplifier has an input terminal coupled to drains of the first and second transistors; and
    a slave branch including:
        second and third current sources coupled to the first and second voltage sources, respectively;
        fourth and fifth transistors coupled in series between the second and third current sources,
        wherein the first and second amplifiers drive gates of the fourth and fifth transistors, respectively, and a first output node is located at a source of the fourth transistor, and a second output node is located at a source of the fifth transistor.

11. The voltage buffer of claim 10, wherein the first voltage source is ground and the second voltage source is VDD.

12. The voltage buffer of claim 11, wherein the first and fourth transistors are NMOS transistor, and the second, third, and fifth transistors are PMOS transistors.

13. The voltage buffer of claim 12, wherein the input terminals for the first and second amplifiers are inverting terminals, and the input terminal for the third amplifier is a non-inverting terminal.

14. The voltage buffer of claim 13, wherein the first, second, and third amplifiers include input terminals for receiving an initial low voltage, an initial high voltage, and an initial mid-range voltage, respectively.

15. The voltage buffer of claim 10, wherein the first voltage source is VDD and the second voltage source is ground.

16. The voltage buffer of claim 15, wherein the first and fourth transistors are PMOS transistor, and the second, third, and fifth transistors are NMOS transistors.

17. The voltage buffer of claim 16, wherein the input terminals for the first and second amplifiers are inverting terminals, and the input to/urinal for the third amplifier is a non-inverting terminal.

18. The voltage buffer of claim 17, wherein the first, second, and third amplifiers include input terminals for receiving an initial high voltage, an initial low voltage, and an initial mid-range voltage, respectively.

19. A method of operating a voltage buffer, the voltage buffer including first, second, and third transistors coupled in series, the method comprising:
    using a first transistor circuit to adjust a voltage level at a source of the first transistor based on a first initial voltage and a current from a current source received at the source of the first transistor;
    using a second transistor circuit to adjust a voltage level at a source of the second transistor based on a second initial voltage and a current received at the source of the second transistor; and
    using a third transistor circuit to adjust a voltage level at a drain of the second transistor based on a third initial voltage.

20. The method of claim 19, wherein the voltage level at the drain of the second transistor is selected to operate the first and second transistors in saturation.

21. The method of claim 19, further comprising generating a first output voltage at the source of the first transistor.

22. The method of claim 21, further comprising generating a second output voltage at the source of the second transistor.

23. The method of claim 22, wherein the first and second output voltages stay substantially constant with transistor size variations, technology parameter variations, supply voltage variations, temperature variations, and current source variations.

24. The method of claim 22, wherein the first transistor circuit includes the first transistor being driven by a first amplifier, the second transistor circuit includes the second transistor being driven by a second amplifier, and the third transistor circuit includes the third transistor being driven by a third amplifier.

* * * * *